(12) United States Patent
Huang et al.

(10) Patent No.: US 11,238,902 B2
(45) Date of Patent: Feb. 1, 2022

(54) CIRCUIT LAYOUT STRUCTURE FOR VOLATILE MEMORY MODULES AND MEMORY STORAGE DEVICE

(71) Applicant: PHISON ELECTRONICS CORP., Miaoli (TW)

(72) Inventors: Ming-Chien Huang, Hsinchu (TW); Chien Ho Liao, New Taipei (TW)

(73) Assignee: PHISON ELECTRONICS CORP., Miaoli (TW)

( * ) Notice: Subject to any disclaimer, the term of this patent is extended or adjusted under 35 U.S.C. 154(b) by 30 days.

(21) Appl. No.: 16/858,748

(22) Filed: Apr. 27, 2020

(65) Prior Publication Data

US 2021/0295877 A1 Sep. 23, 2021

(30) Foreign Application Priority Data

Mar. 20, 2020 (TW) .................................. 109109334

(51) Int. Cl.
*G11C 5/02* (2006.01)
*G11C 11/406* (2006.01)
*G11C 5/06* (2006.01)

(52) U.S. Cl.
CPC ................ *G11C 5/025* (2013.01); *G11C 5/06* (2013.01); *G11C 11/40615* (2013.01)

(58) Field of Classification Search
CPC ..... G11C 5/025; G11C 11/40615; G11C 5/06; G11C 14/0018
See application file for complete search history.

(56) References Cited

U.S. PATENT DOCUMENTS 10,497,457 B2 * 12/2019 Tsern ................ G11C 29/50016
2018/0033485 A1 * 2/2018 Song .................... G11C 11/4072

* cited by examiner

*Primary Examiner* — David Lam
(74) *Attorney, Agent, or Firm* — JCIPRNET

(57) ABSTRACT

A circuit layout structure and a memory storage device are disclosed. The circuit layout structure includes a plurality of first volatile memory modules, a plurality of second volatile memory modules, a first data line, a second data line, a first clock enable signal line and a second clock enable signal line. The first data line is configured to access the first volatile memory modules in parallel by a first sequential bit group. The second data line is configured to access the second volatile memory modules in parallel by a second sequential bit group. The first clock enable signal line and the second clock enable signal line are configured to control the first volatile memory modules and the second volatile memory modules to enter a self-refresh mode respectively.

18 Claims, 5 Drawing Sheets

CIRCUIT LAYOUT STRUCTURE FOR VOLATILE MEMORY MODULES AND MEMORY STORAGE DEVICE

CROSS-REFERENCE TO RELATED APPLICATION

This application claims the priority benefit of Taiwan application serial no. 109109334, filed on Mar. 20, 2020. The entirety of the above-mentioned patent application is hereby incorporated by reference herein and made a part of this specification.

BACKGROUND

Technical Field

The present invention relates to a circuit layout technology, and particularly to a circuit layout structure and memory storage device.

Description of Related Art

In some types of volatile memory layout structures, a clock signal line, a command address signal line, and a clock enable signal line are all wired in a fly-by topology. For example, in the fly-by topology, the clock signal line, the command address signal line and the clock enable signal line can pass through a plurality of volatile memory modules to control all volatile memory modules on the signal transmission path at the same time. However, this wiring method may cause signal transmission errors between different volatile memory modules due to the long signal transmission path.

SUMMARY

The present invention provides a circuit layout structure and a memory storage device, which can reduce the signal transmission error between different volatile memory modules.

In an exemplary embodiment, a circuit layout structure including a plurality of first volatile memory modules, a plurality of second volatile memory modules, a first data line, a second data line, a first clock enable signal line and second clock enable signal line is provided. The first data line is coupled to the plurality of first volatile memory modules to access at least one of the first volatile memory modules in parallel by a first sequential bit group. The second data line is coupled to the plurality of second volatile memory modules to access at least one of the second volatile memory modules in parallel by a second sequential bit group. The first clock enable signal line is coupled to the plurality of first volatile memory modules to control the plurality of first volatile memory modules to enter the self-refresh mode in parallel. The second clock enable signal line is coupled to the plurality of second volatile memory modules to control the plurality of second volatile memory modules to enter the self-refresh mode in parallel.

In an exemplary embodiment, a memory storage device, which includes a rewritable non-volatile memory module, a plurality of first volatile memory modules, a plurality of second volatile memory modules, first data line, second data line, first clock enable signal line, second clock enable signal line and memory control circuit unit, is provided. The first data line is coupled to the plurality of first volatile memory modules to access at least one of the first volatile memory modules in parallel by a first sequential bit group. The second data line is coupled to the plurality of second volatile memory modules to access at least one of the second volatile memory modules in parallel by a second sequential bit group. The first clock enable signal line is coupled to the plurality of first volatile memory modules to control the plurality of first volatile memory modules to enter the self-refresh mode in parallel. The second clock enable signal line is coupled to the plurality of second volatile memory modules to control the plurality of second volatile memory modules to enter the self-refresh mode in parallel. The memory control circuit unit is coupled to the rewritable non-volatile memory module, the first data line, the second data line, the first clock enable signal line and the second clock enable signal line.

In an exemplary embodiment, a circuit layout structure including a plurality of volatile memory modules and a clock enable signal line is provided. The plurality of volatile memory modules include a plurality of volatile memory modules belonging to a first stage and a plurality of volatile memory modules belonging to a second stage. At a specific time, only the plurality of volatile memory modules belonging to one of the first stage and the second stage are operated. The clock enable signal line is coupled to one of the volatile memory modules belonging to the first stage and one of the volatile memory modules belonging to the second stage.

In an exemplary embodiment, a memory storage device, which includes a rewritable non-volatile memory module, a plurality of volatile memory modules, a clock enable signal line and a memory control circuit unit, is provided. The volatile memory modules include a plurality of volatile memory modules belonging to a first stage and a plurality of volatile memory modules belonging to a second stage. At a specific time, only the plurality of volatile memory modules belonging to one of the first stage and the second stage are operated. The clock enable signal line is coupled to one of the volatile memory modules belonging to the first stage and one of the volatile memory modules belonging to the second stage. The memory control circuit unit is coupled to the rewritable non-volatile memory module, the plurality of volatile memory modules and the clock enable signal line.

Based on the above, after using the same or similar wiring method between the data line and the volatile memory module to configure the clock enable signal line, the controlling of a plurality of volatile memory modules by the clock enable signal line can be more precise.

It should be understood, however, that this Summary may not contain all of the aspects and embodiments of the present invention, is not meant to be limiting or restrictive in any manner, and that the present invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the present invention, and are incorporated in and constitute a part of this specification. The drawings illustrate embodiments of the present invention and, together with the description, serve to explain the principles of the present invention.

DESCRIPTION OF THE EMBODIMENTS

Figure 1:
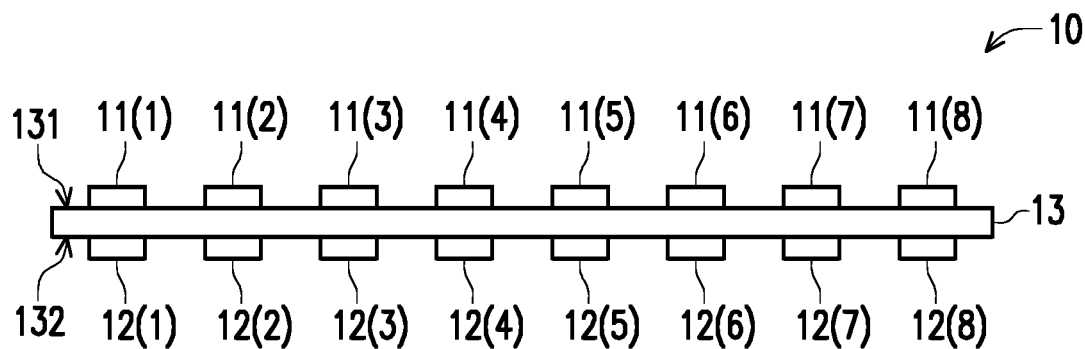
FIG. 1 is an appearance diagram illustrating a circuit layout structure according to an exemplary embodiment.

Reference will now be made in detail to the exemplary embodiments of the invention, examples of which are illustrated in the accompanying drawings. Wherever possible, the same reference numbers are used in the drawings and the description to refer to the same or like parts.

Embodiments of the invention may comprise any one or more of the novel features described herein, including in the detailed description, and/or shown in the drawings. As used herein, "at least one," "one or more," and "and/or" are open-ended expressions that are both conjunctive and disjunctive in operation. For instance, each of the expressions "at least on of A, B and C," "at least one of A, B, or C," "one or more of A, B, and C," "one or more of A, B, or C," and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more," and "at least one" can be used interchangeably herein.

Exemplary embodiments hereafter are used to explain the present invention, but the present invention is not limited to the illustrated exemplary embodiments. And, the appropriate combinations between the exemplary embodiments are allowed. The term "coupled" used in this disclosure may refer to any direct or indirect connection means. For example, if it is described that the first device is coupled to the second device, it should be interpreted that the first device can be directly connected to the second device, or the first device can be connected indirectly to the second device through other devices or connection manners. Additionally, the term "signal" may refer to at least one current, voltage, charge, temperature, data, or any other one or more signals.

FIG. 1 is an appearance diagram (i.e., a side view) illustrating a circuit layout structure according to an exemplary embodiment.

Referring to FIG. 1, the circuit layout structure 10 includes volatile memory modules 11(1)~11(8), volatile memory modules 12(1)~12(8), and a substrate 13. Each of the volatile memory modules 11(1)~11(8) and volatile memory modules 12(1)~12(8) may contain a plurality of volatile memory units. For example, in the case of power on, each memory unit can be used to store one or more bits. After power off, the data stored in the memory unit will be lost.

In an exemplary embodiment, each of the volatile memory modules 11(1)~11(8) and 12(1)~12(8) may include one rank or other management unit for the memory unit. Taking the rank as an example, at a single point in time, only volatile memory modules belonging to the same rank are allowed to be operated. Taking FIG. 2 as an example, it is assumed that the volatile memory modules 11(1), 11(3), 11(5), and 11(7) belong to the same rank (for example, the first rank, which is labeled as Rank1), the volatile memory modules 11(2), 11(4), 11(6), and 11(8) belong to the same rank (for example, the second rank, which is labeled as Rank2), and the volatile memory modules 12(1), 12(3), 12(5) and 12(7) belong to the same rank (for example the third rank, which is labeled as Rank3), and the volatile memory modules 12(2), 12(4), 12(6) and 12(8) belongs to the same rank (for example the third rank, which is labeled as Rank4). At a point in time, only volatile memory modules belonging to one of the first to fourth ranks (for example, the first-rank volatile memory modules 11(1), 11(3), 11(5) and 11(7) or second-rank volatile memory modules 11(2), 11(4), 11(6) and 11(8)) can be accessed in parallel. In an example embodiment, the chip select (CS) signal may be used with the control command to select a rank of volatile memory modules for data accessing.

In an exemplary embodiment, the volatile memory modules 11(1)~11(8) and 12(1)~12(8) are dynamic random-access memories (DRAMs). However, in another exemplary embodiment, the volatile memory modules 11(1)~11(8) and 12(1)~12(8) may also be other types of volatile memory modules, such as static random-access memories (SRAMs).

In an exemplary embodiment, the volatile memory modules 11(1) to 11(8) are arranged side by side on the surface 131 of the substrate 13, and the volatile memory modules 12(1) to 12(8) are arranged side by side on the surface 132 of the substrate 13. If one of the surfaces 131 and 132 is considered as the front surface of the substrate 13, the other of the surfaces 131 and 132 can be considered as the rear surface of the substrate 13.

Figure 2:
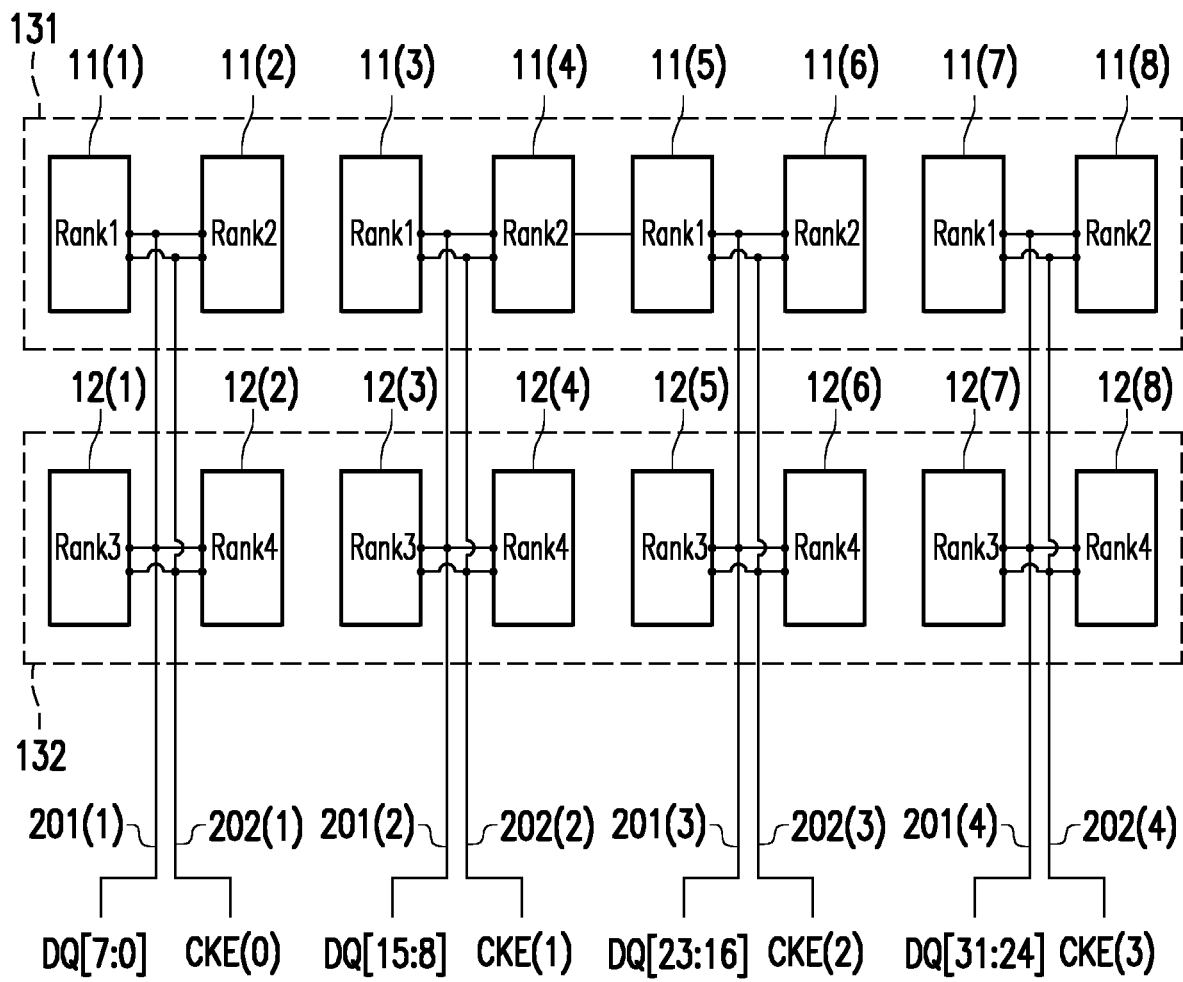
FIG. 2 is a schematic diagram illustrating a line coupling relationship between a data line, a clock enable signal line and a volatile memory module according to an exemplary embodiment.

FIG. 2 is a schematic diagram illustrating a line coupling relationship between a data line, a clock enable signal line and a volatile memory module according to an exemplary embodiment.

Referring to FIG. 1 and FIG. 2, in an exemplary embodiment, the circuit layout structure 10 further includes data lines 201(1)~201(4) and clock enable signal lines 202(1)~202(4). The data line 201(1) is coupled to the volatile memory modules 11(1), 11(2), 12(1) and 12(2) and configured to access data to/from at least one of the volatile memory modules 11(1), 11(2), 12(1) and 12(2) through a continuous bit group DQ[7:0]. For example, the continuous bit group DQ [7:0] contains 8 data bits transmitted via the data line 201(1).

The data line 201(2) is coupled to the volatile memory modules 11(3), 11(4), 12(3), and 12(4) and configured to access data to/from at least one of the volatile memory modules 11(3), 11(4), 12(3) and 12(4) through a continuous bit group DQ [15:8]. For example, the continuous bit group DQ [15:8] contains 8 data bits transmitted via the data line 201(2).

The data line 201(3) is coupled to the volatile memory modules 11(5), 11(6), 12(5), and 12(6) and configured to access data to/from at least one of the volatile memory modules 11(5), 11(6), 12(5) and 12(6) through a continuous bit group DQ [23:16]. For example, the continuous bit group DQ [23:16] contains 8 data bits transmitted via the data line 201(3).

The data line 201(4) is coupled to the volatile memory modules 11(7), 11(8), 12(7), and 12(8) and configured to access data to/from at least one of volatile memory modules 11 (7), 11(8), 12(7) and 12(8) through a continuous bit group DQ [31:24]. For example, the continuous bit group DQ [31:24] contains 8 data bits transmitted via the data line 201(4).

In an exemplary embodiment, the data lines 201(1)~201(4) may correspond to 4 channels. The memory control circuit unit or memory controller (not shown) may use 32 data bits DQ [31:0] to access data to/from a prat of the volatile memory modules 11(1)~11(8) and 12(1)~12(8) in parallel via the data lines 201(1)~201(4). For example, in an exemplary embodiment, data on the volatile memory modules 11(1), 11(3), 11(5), and 11(7) belonging to the first-rank may be accessed via the data lines 201 (1)~201 (4) in parallel.

The same as or similar to the data line 201(1), clock enable signal line 202(1) is also coupled to the volatile memory modules 11(1), 11(2), 12(1) and 12(2) to control the volatile memory modules 11(1), 11(2), 12(1) and 12(2) to enter a self-refresh mode in parallel.

For example, when the volatile memory modules 11(1), 11(2), 12(1) and 12(2) enter the self-refresh mode, the signal CKE(0) transmitted by the clock enable signal line 202 (1) will be at a low voltage level. In addition, the volatile memory modules 11(3)~11(8) and 12(3)~12(8) are not controlled by the clock enable signal line 202(1).

The same as or similar to the data line 201(2), the clock enable signal line 202(2) is also coupled to the volatile memory modules 11(3), 11(4), 12(3) and 12(4) to control the volatile memory modules 11(3), 11(4), 12(3) and 12(4) to enter the self-refresh mode in parallel. For example, when the volatile memory modules 11(3), 11(4), 12(3) and 12(4) enter the self-refresh mode, the signal CKE(1) transmitted by the clock enable signal line 202(2) will be at a low voltage level. In addition, volatile memory modules 11(1), 11(2), 11(5)~11(8) and 12(1), 12(2), 12(5)~12(8) are not controlled by the clock enable signal line 202(2).

The same as or similar to the data line 201(3), the clock enable signal line 202(3) is also coupled to the volatile memory modules 11(5), 11(6), 12(5) and 12(6) to control the volatile memory modules 11(5), 11(6), 12(5) and 12(6) to enter the self-refresh mode in parallel. For example, when the volatile memory modules 11(5), 11(6), 12(5) and 12(6) enter the self-refresh mode, the signal CKE(2) transmitted by the clock enable signal line 202(3) will be at a low voltage level. In addition, the volatile memory modules 11(1)~11(4), 11(7), 11(8) and 12(1)~12(4), 12(7), 12(8) are not controlled by the clock enable signal line 202(3).

The same as or similar to the data line 201(4), the clock enable signal line 202(4) is also coupled to the volatile memory modules 11(7), 11(8), 12(7) and 12(8) to control the volatile memory modules 11(7), 11(8), 12(7) and 12(8) to enter the self-refresh mode in parallel. For example, when the volatile memory modules 11(7), 11(8), 12(7) and 12(8) enter the self-refresh mode, the signal CKE(3) transmitted by the clock enable signal line 202 (4) will be at a low voltage level. In addition, the volatile memory modules 11(1)~11(6) and 12(1)~12(6) are not controlled by the clock enable signal line 202(4).

In an exemplary embodiment, a plurality of volatile memory modules entering the self-refresh mode in parallel may represent that the volatile memory modules enter the self-refresh mode at the same time or the volatile memory modules enter the self-refresh mode at nearly the same time. In an exemplary embodiment, a memory control circuit unit or a memory controller (not shown) may control the signals CKE(0)~CKE(3) transmitted by the clock enable signal lines 202(1)~202(4) at a low voltage level, such that the volatile memory modules 11(1)~11(8) and 12(1)~12(8) enter the self-refresh mode at the same time.

In an exemplary embodiment, in the self-refresh mode, the volatile memory module may maintain and/or update the data stored in it. In an exemplary embodiment, when the memory storage device (not shown) including the circuit layout structure 10 enters the power saving mode or the sleep mode, the memory control circuit unit or the memory controller (not shown) may instruct the volatile memory modules 11(1)~11(8) and 12(1)~12(8) to enter the self-refresh mode at the same time.

Figure 3A:
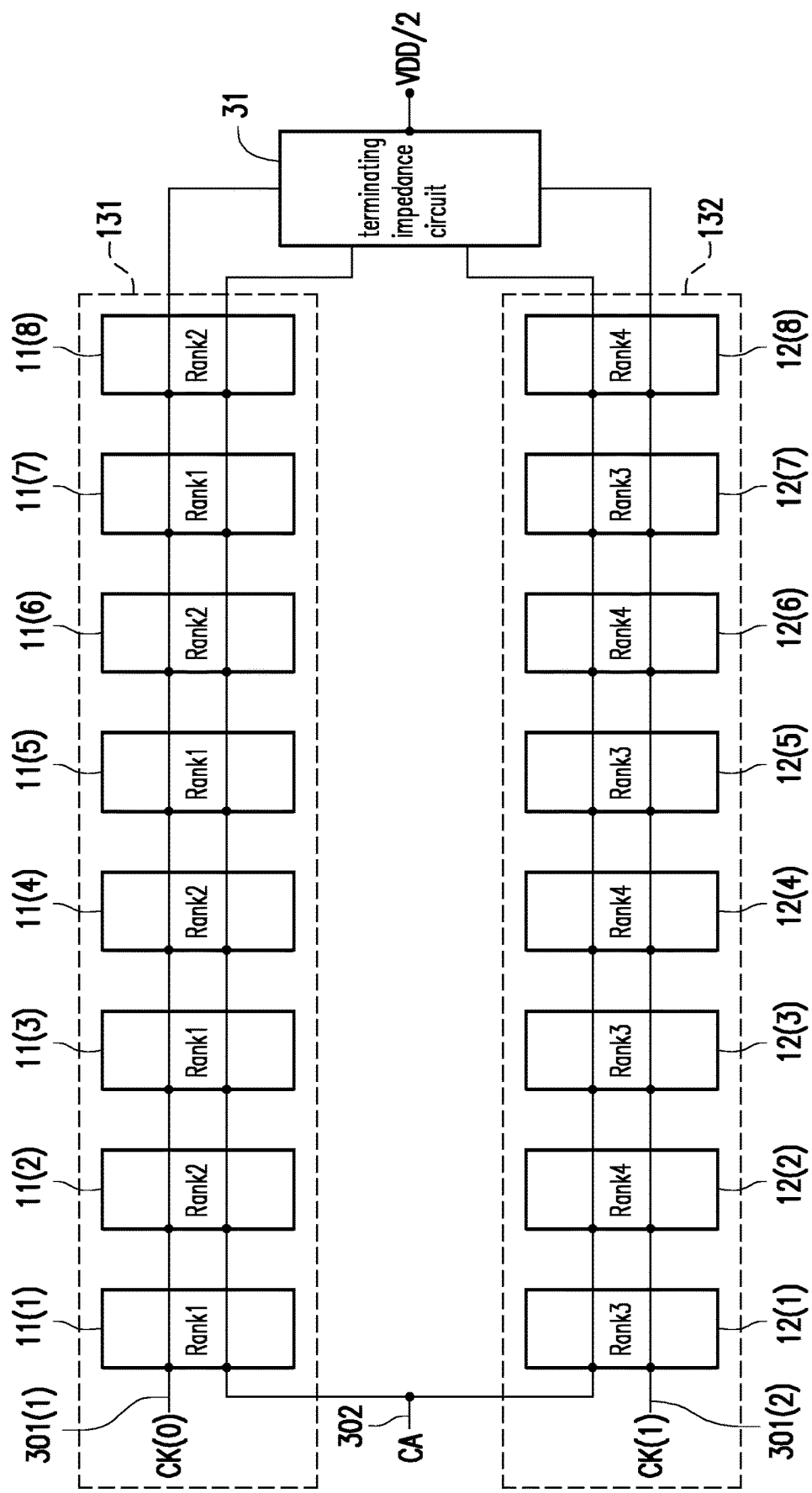
FIG. 3A is a schematic diagram illustrating a line coupling relationship between a clock signal line, a command address signal line and a volatile memory module according to an exemplary embodiment.

FIG. 3A is a schematic diagram illustrating a line coupling relationship between a clock signal line, a command address signal line and a volatile memory module according to an exemplary embodiment.

Referring to FIG. 1 and FIG. 3A, in an exemplary embodiment, the circuit layout structure 10 further includes a clock signal line 301(1), a clock signal line 301(2), and a command address signal line 302. The clock signal line 301(1), the clock signal line 301(2) and the command address signal line 302 are connected to the volatile memory modules 11(1)~11(8) and 12(1)~12(8) in the fly-by coupling manner (also known as the fly-by topology structure). For example, the clock signal line 301(1) is connected to the volatile memory modules 11(1)~11(8) in the fly-by coupling manner to transmit the clock signal CK(0) to the volatile memory modules 11(1)~11(8). For example, the clock signal line 301(2) is connected to the volatile memory modules 12(1)~12(8) in the fly-by coupling manner to transmit the clock signal CK(1) to the volatile memory module 12(1)~12(8). For example, the command address signal line 302 is simultaneously connected to the volatile memory modules 11(1)~11(8) and 12(1)~12(8) in the fly-by coupling manner to transmit the signal CA having access addresses and/or access commands to the volatile memory modules 11(1)~11(8) and 12(1)~12(8).

In an exemplary embodiment, one end of the clock signal line 301(1), the clock signal line 301(2), and the command address signal line 302 may be coupled to the memory control circuit unit or the memory controller (not shown), and the other end of the clock signal line 301(1), the clock signal line 301(2) and the command address signal line 302, which are crossing the volatile memory modules 11(1)~11(8) and 12(1)~12(8), may be coupled to the terminating impedance circuit 31. The termination impedance circuit 31 may be additionally coupled to the power supply VDD/2. The termination impedance circuit 31 may include at least one impedance element (e.g., a resistor) to provide the termination impedance to the clock signal line 301(1), the clock signal line 301(2), and the command address signal line 302. The termination impedance may make the signals transmitted by the clock signal line 301(1), the clock signal line 301(2) and the command address signal line 302 more stable (for example, the signal error may be reduced).

In an exemplary embodiment, the circuit layout structure 10 of FIG. 1 may include the data lines 201(1)~201(4) and the clock enable signal lines 202(1)~202(4), the clock signal line 301(1), the clock signal line 301(2) and the command address signal line 302 shown in FIG. 2 and FIG. 3A. The layout structure of these circuits may be referred to the exemplary embodiments of FIG. 2 and FIG. 3A, and will not be repeated here.

In an exemplary embodiment, the memory control circuit unit or memory controller (not shown) may send a signal CA having an instruction entering the self-refresh mode and control the signals CKE (0)~CKE (3) transmitted by the enable the clock enable signal line 202(1)~202(4) at a low voltage level. When the volatile memory modules 11(1)~11(8) and 12(1)~12(8) receive the signal CA having the instruction entering the self-refresh mode and detect that the clock enable signal lines 202(1)~202(4) are in a low voltage level, the volatile memory modules 11(1)~11(8) and 12(1)~12(8) may enter the self-refresh mode.

Figure 3B:
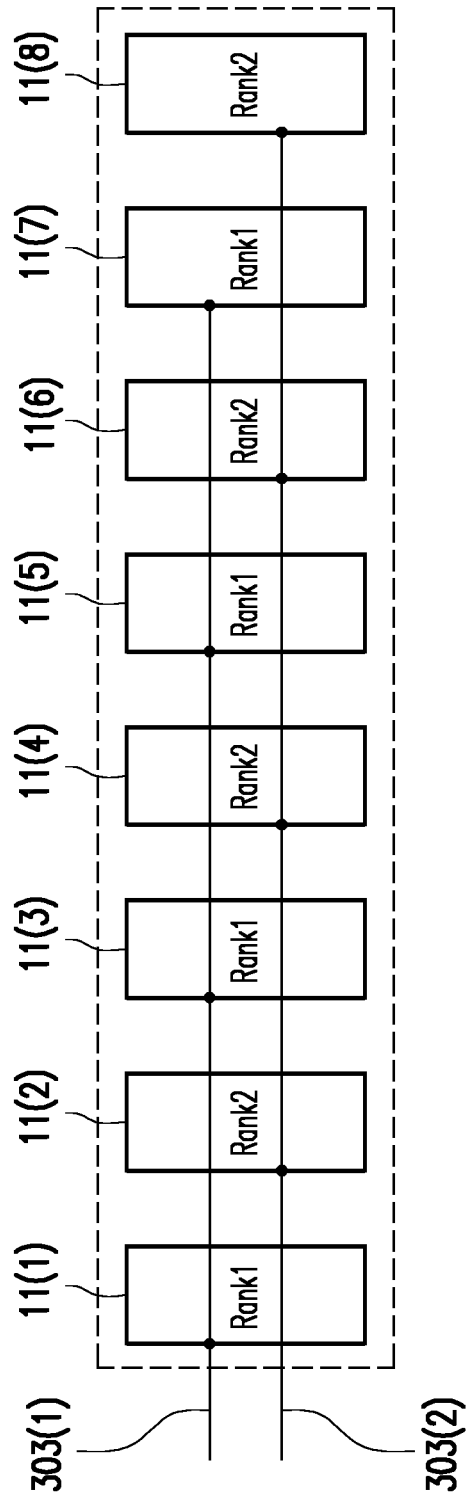
FIG. 3B is a schematic diagram illustrating a line coupling relationship between a chip selection signal line and a volatile memory module according to an exemplary embodiment.
Figure 3B:
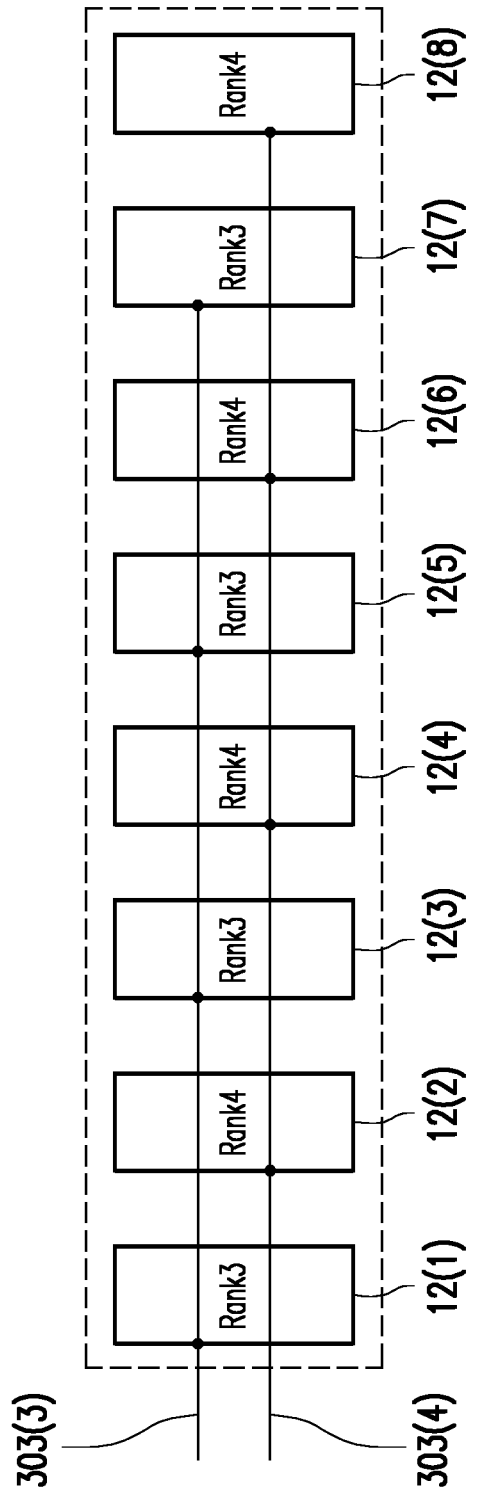

In an example embodiment combining FIG. 2 and FIG. 3, the clock signal line 301(1), the clock signal line 301 (2), and the command address signal line 302 may be coupled to the termination impedance circuit 31 to improve the stability of the transmitted signal. However, it should be noted that the clock enable signal lines 202(1)~202(4) are not coupled to the termination impedance circuit 31, thereby avoiding the leakage current when at a low voltage level. In addition, because the clock enable signal lines 202(1)~202(4) are not coupled to the termination impedance circuit 31, the needed power may be reduced.

From another perspective, in the exemplary embodiment of FIG. 2, the clock enable signal lines 202(1)~202(4) are coupled to volatile memory modules 11(1)~11(8) and 12(1)~12(8) with the manner, which is the same as or similar to the data lines 201(1)~201(4), instead of the fly-by coupling manner. Therefore, even if the clock enable signal lines 202(1)~202(4) are not coupled to the terminating impedance circuit 31, the signal quality of the signals transmitted by the clock enable signal lines 202(1)~202(4) may be stable.

FIG. 3B is a schematic diagram illustrating a line coupling relationship between a chip selection signal line and a volatile memory module according to an exemplary embodiment.

Referring to FIG. 1 and FIG. 3B, in an exemplary embodiment, the circuit layout structure 10 further includes chip selection signal lines 303(1) to 303(4) for transferring chip selection signals. The chip select signal lines 303(1)~303(4) are respectively coupled to the volatile memory modules belonging to the first to fourth ranks.

In an exemplary embodiment, one end of the chip selection signal lines 303(1) to 303(4) may be coupled to a memory control circuit unit or a memory controller (not shown). The other end of the chip select signal lines 303(1)~303(4) may not be coupled to the termination impedance (e.g., the termination impedance circuit 31 of FIG. 3A).

At a point in time, the memory control circuit unit or memory controller (not shown) may send the chip select signal to volatile memory modules belonging to one of the first-rank to fourth-rank through one of the chip select signal lines 303(1)~303(4) to select and/or enable the specific volatile memory modules. For example, at a point in time, the chip select signal line 303(1) may send the chip select signal to the volatile memory modules 11(1), 11(3), 11(5), and 11(7) belonging to the first-rank, such that the volatile memory modules 11(1), 11(3), 11(5), and 11(7) start to operate (e.g., data accessing).

In an exemplary embodiment, the circuit layout structure 10 of FIG. 1 may include the data lines 201(1) to 201(4), the clock enable signal line 202(1)~202(4), the clock signal line 301(1), the clock signal line 301(2), the command address signal line 302 and the chip select signal line 303(1)~303(4) shown in FIG. 2, FIG. 3A and FIG. 3B. The layout structure of these lines may refer to the exemplary embodiments of FIG. 2, FIG. 3A and FIG. 3B, and the details are not repeated here.

It should be noted that in the exemplary embodiments of FIG. 1, FIG. 2, FIG. 3A and FIG. 3B, the total number of the volatile memory modules 11(1)~11(8), the total number of the volatile memory modules 12(1)~12(8), the total number of the data lines 201(1)~201(4), the total number of the clock enable signal lines 202(1)~202(4) and the total number of the chip selection signal lines 303(1)~303(4) may be more or less, and the present invention is not limited thereto. In addition, the total number (e.g., 4) of the volatile memory modules coupled to a single data line (e.g., the data line 201(1)) and/or a single clock enable signal line (e.g., the clock enable signal line 202 (1)) may also be more or less, and the present invention is not limited thereto.

In an exemplary embodiment, the circuit layout structure 10 of FIG. 1 may be disposed in a memory storage device. Generally, a memory storage device (also known as a memory storage system) includes a rewritable non-volatile memory module and a controller (also known as a control circuit). The memory storage device is usually configured together with a host system so that the host system may write data into the memory storage device or read data from the memory storage device.

Figure 4:
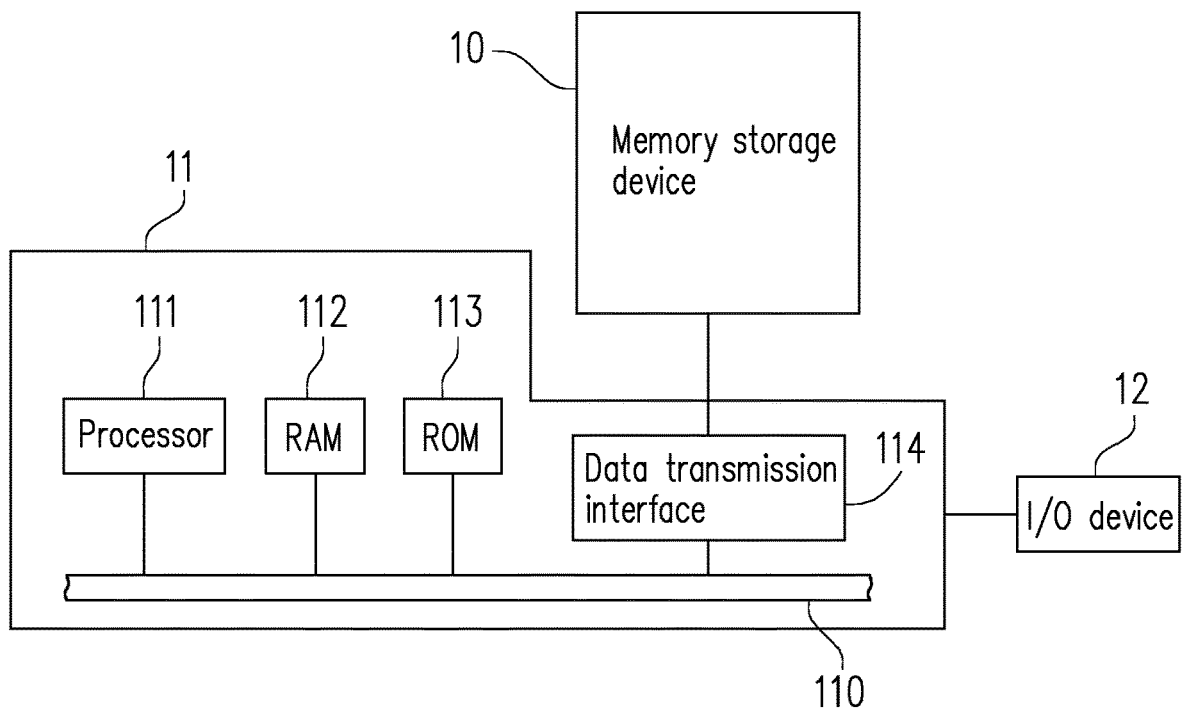
FIG. 4 is a schematic diagram illustrating a host system, a memory storage device, and an input/output (I/O) device according to an exemplary embodiment.
Figure 5:
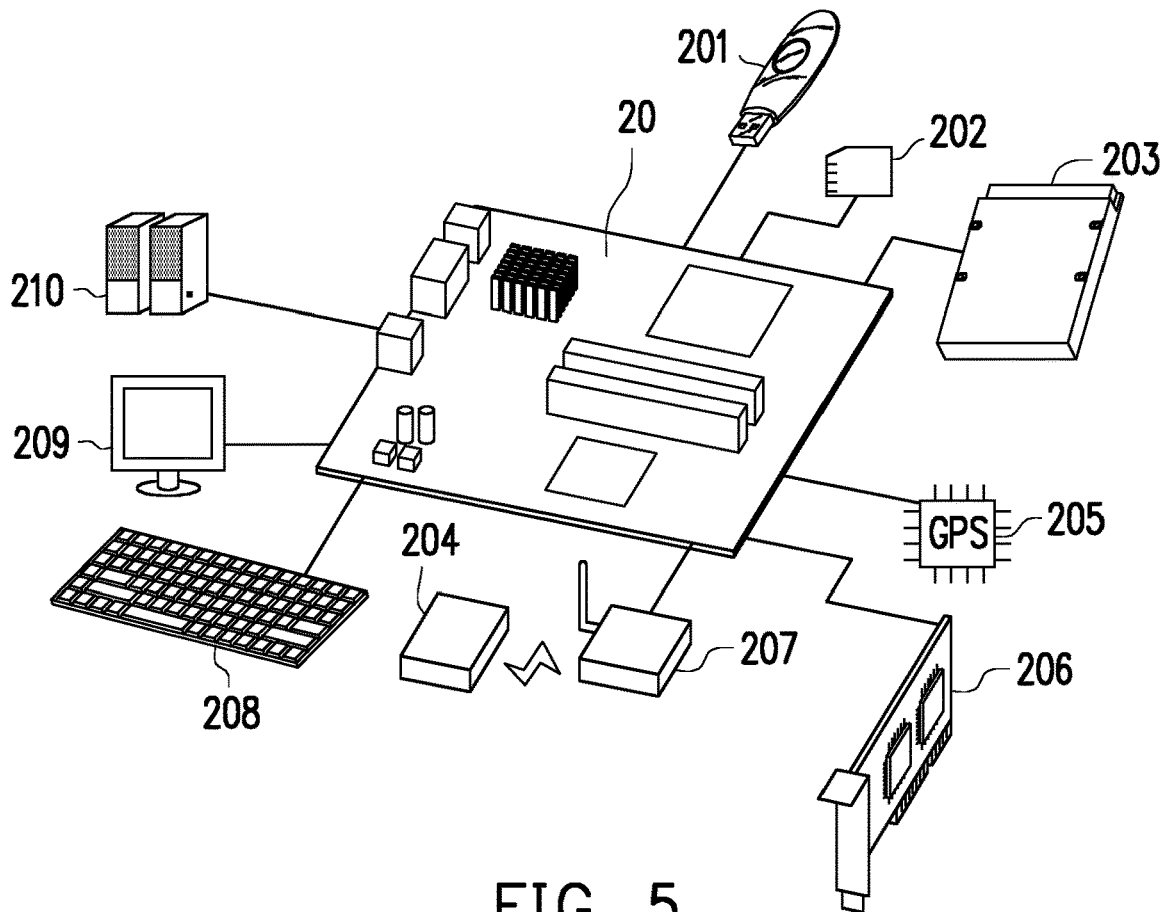
FIG. 5 is a schematic diagram illustrating a host system, a memory storage device, and an I/O device according to another exemplary embodiment.

FIG. 4 is a schematic diagram illustrating a host system, a memory storage device, and an input/output (I/O) device according to an exemplary embodiment, and FIG. 5 is a schematic diagram illustrating a host system, a memory storage device, and an I/O device according to another exemplary embodiment.

Referring to FIG. 4 and FIG. 5, a host system 511 generally includes a processor 511, a random access memory (RAM) 512, a read only memory (ROM) 513 and a data transmission interface 514. The processor 511, the RAM 512, the ROM 513 and the data transmission interface 514 are coupled to a system bus 510.

In the present exemplary embodiment, the host system 51 is coupled to a memory storage device 50 through the data transmission interface 514. For example, the host system 51 may write data into the memory storage device 50 or read data from the memory storage device 50 through the data transmission interface 514. Further, the host system 511 is coupled to an I/O device 52 through the system bus 510. For example, the host system 51 may transmit output signals to the I/O device 52 or receive input signals from the I/O device 52 through the system bus 510.

In the present exemplary embodiment, the processor 511, the RAM 512, the ROM 513 and the data transmission interface 514 are disposed on a motherboard 60 of the host system 51. The number of the data transmission interface 514 may be one or plural. Through the data transmission interface 514, the motherboard 60 may be coupled to the memory storage device 50 in a wired manner or a wireless manner. The memory storage device 60 may be, for example, a flash drive 601, a memory card 602, a solid state drive (SSD) 603 or a wireless memory storage device 604. The wireless memory storage device 604 may be, for example, a memory storage device based on various wireless communication technologies, such as a near field communication storage (NFC) memory storage device, a wireless fidelity (Wi-Fi) memory storage device, a Bluetooth memory storage device or a Bluetooth low energy (BLE) memory storage device (e.g., iBeacon). Moreover, the motherboard 60 may also be coupled to various I/O devices, such as a global positioning system (GPS) module 605, a network interface card 606, a wireless transmission device 607, a keyboard 608, a screen 609, a loudspeaker 610, etc., through the system bus 610. For example, in an exemplary embodiment, the motherboard 60 may access the wireless memory storage device 604 through the wireless transmission device 607.

Figure 6:
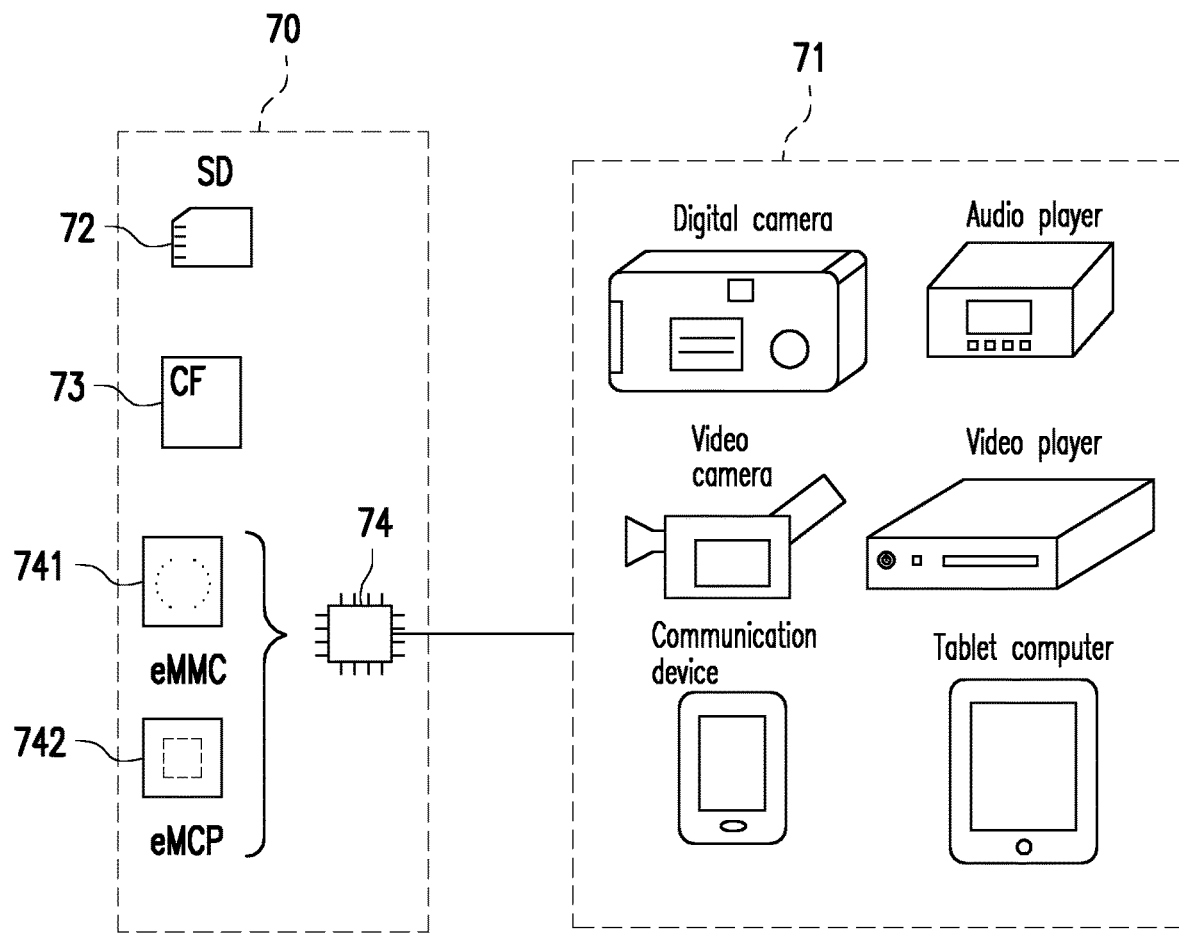
FIG. 6 is a schematic diagram illustrating a host system and a memory storage device according to another exemplary embodiment.

In an exemplary embodiment, the aforementioned host system may be any system substantially cooperated with the memory storage device for storing data. Even though the host system implemented by a computer system is taken as an example for description in the exemplary embodiment above, FIG. 6 is a schematic diagram illustrating a host system and a memory storage device according to another exemplary embodiment. Referring to FIG. 6, in another exemplary embodiment, a host system 71 may also be a system, e.g., a digital camera, a video camera, a communication device, an audio player, a video player or a tablet PC, etc., and the memory storage device 30 may be a non-volatile memory storage device, such as a secure digital (SD) card 72, a compact flash (CF) card 73, or an embedded storage apparatus 74, etc., used by the host system 71. The embedded storage apparatus 74 includes an embedded multimedia card (eMMC) 741 and/or an embedded multi chip package (eMCP) storage apparatus 742, etc., that is formed by directly coupling various memory modules to a substrate of the host system.

Figure 7:
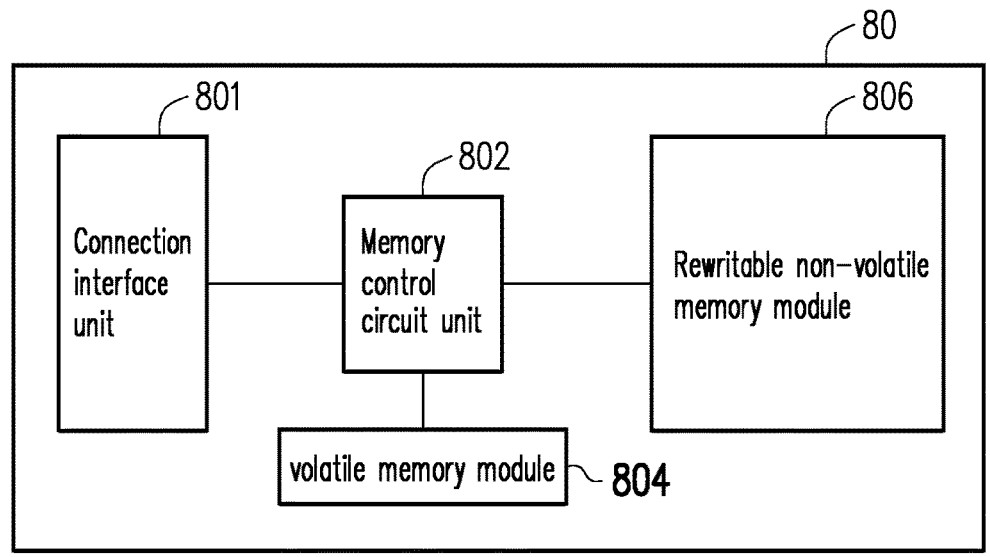
FIG. 7 is a schematic block diagram illustrating a memory storage device according to an exemplary embodiment.

FIG. 7 is a schematic block diagram illustrating a memory storage device according to an exemplary embodiment.

Referring to FIG. 7, the memory storage device 80 includes a connection interface unit 801, a memory control circuit unit (also referred as a memory controller) 802, a rewritable non-volatile memory module 803 and a volatile memory module 804. For example, the volatile memory module 804 may include the volatile memory modules 11(1)~11(8) and 12(1)~12(8) shown in FIG. 1 to FIG. 3.

In an exemplary embodiment, the connection interface unit 801, the memory control circuit unit 802, the rewritable non-volatile memory module 803 and the volatile memory module 804 may be disposed on the substrate 13 of FIG. 1. The memory control circuit unit 802 may control or access the volatile memory modules 11(1)~11(8) and 12(1)~12(8) via the data lines 201(1)~201(4), the clock enable signal lines 202(1)~202(4), the clock signal line 301(1), the clock signal line 301(2) and the command address signal line 302.

The connection interface unit 801 complies with a serial advanced technology attachment (SATA) standard. However, it should be noted that the present invention is not limited thereto, and the connection interface unit 801 may also comply with a parallel advanced technology attachment (PATA) standard, an institute of electrical and electronic engineers (IEEE) 1394 standard, a peripheral component interconnect (PCI) express standard, a universal serial bus (USB) standard, an ultra high speed-I (UHS-I) interface standard, an ultra high speed-II (UHS-II) interface standard, a secure digital (SD) interface standard, a memory stick (MS) interface standard, a multi-chip package interface standard, a multimedia card (MMC) interface standard, an embedded multimedia card (eMMC) interface standard, a universal flash storage (UFS) interface standard, an embedded multi chip package (eMCP) interface standard, a compact flash (CF) interface standard, an integrated device electronics (IDE) standard or other suitable standards. In the present exemplary embodiment, the connection interface unit 801 and the memory control circuit unit 802 may be packaged in a chip, or the connection interface unit 801 is configured outside a chip containing the memory control circuit unit.

The memory control circuit unit 802 is configured to execute a plurality of logic gates or control instructions implemented in a hardware form or a firmware form and perform operations, such as data writing, data reading and data erasing, in the rewritable non-volatile memory module 803 according to commands of the host system.

The rewritable non-volatile memory module 803 is coupled to the memory control circuit unit 802 and configured to store data written by the host system. The rewritable non-volatile memory module 803 may be a single level cell (SLC) NAND flash memory module (i.e., a flash memory module in which a memory cell is capable of storing data of 1 bit), a multi level cell (MLC) NAND flash memory module (i.e., a flash memory module in which a memory cell is capable of storing data of 2 bits), a triple level cell (TLC) NAND flash memory module (i.e., a flash memory module in which a memory cell is capable of storing data of 3 bits), a quad level cell (QLC) NAND flash memory module (i.e., a flash memory module in which a memory cell is capable of storing data of 4 bits), other flash memory modules or other memory modules having the same characteristics.

Each memory cell in the rewritable non-volatile memory module 803 stores one or more bits by changing a voltage (hereinafter, also known as a threshold voltage). Specifically, a charge trapping layer is provided between a control gate and a channel in each memory cell. An amount of electrons in the charge trapping layer may be changed by applying a write voltage to the control gate, so as to change the threshold voltage of the memory cell. The process of changing the threshold voltage is also referred to as "writing data into the memory cell" or "programming the memory cell". As the threshold voltage is changed, each memory cell in the rewritable non-volatile memory module 803 has a plurality of storage states. A storage state of a memory cell may be determined through applying a read voltage, and thereby, one or more bits stored in the memory cell may be obtained.

In the present exemplary embodiment, the memory cells of the rewritable non-volatile memory module 803 construct a plurality of physical programming units, and the physical programming units construct a plurality of physical erasing units. To be specific, the memory cells on a same word line construct one or more physical programming units. If each memory cell is capable of storing two or more bits, the physical programming units on the same word line may be categorized into a lower physical programming unit and an upper physical programming unit. For example, the least significant bit (LSB) of a memory cell belongs to the lower physical programming unit, and the most significant bit (MSB) of a memory cells belongs to the upper physical programming unit. Generally, in an MLC NAND flash memory, a writing speed of the lower physical programming unit is greater than a writing speed of the upper physical programming unit, and/or reliability of the lower physical programming unit is higher than reliability of the upper physical programming unit.

In the present exemplary embodiment, a physical programming unit is the smallest unit for programming data. Namely, the physical programming unit is the smallest unit for writing data. For example, the physical programming unit is a physical page or a physical sector. If the physical programming unit is a physical page, each physical programming unit usually includes a data bit area and a redundant bit area. The data bit area includes a plurality of physical sectors for storing user data, and the redundant bit area is configured for storing system data (e.g., control information and error correcting codes). In the present exemplary embodiment, the data bit area of each physical programming unit contains 32 physical sectors, and the size of each physical access addresses is 512 bytes. However, in other exemplary embodiments, the data bit area may also contain 8, 16 or more or less physical sectors, and the size and the number of the physical sectors may be more or less. For example, in an exemplary embodiment, a physical erasing unit is a physical block, and a physical programming unit is a physical page or a physical sector, but the present invention is not limited thereto. And, a physical erasing unit is the smallest unit for erasing data. Namely, each physical erasing unit contains the least number of memory cells to be erased altogether. For example, the physical erasing unit is a physical block.

In summary, after using the same or similar wiring method between the data line and the volatile memory module to configure the clock enable signal line, the controlling of a plurality of volatile memory modules by the clock enable signal line can be more precise. In addition, even if the clock enable signal line is not connected to the termination impedance circuit, the stability of the signal on the clock enable signal line can still be maintained. The previously described exemplary embodiments of the present invention have the advantages aforementioned, wherein the advantages aforementioned not required in all versions of the present invention.

Although the present invention has been disclosed as above with examples, it is not intended to limit the present invention. Any person with ordinary knowledge in the technical field can make some changes and modifications without departing from the spirit and scope of the present invention. Therefore, the scope of protection of the present invention shall be deemed as defined in the appended patent application scope.

What is claimed is:

1. A circuit layout structure, including:
  a plurality of first volatile memory modules belonging to different ranks;
  a plurality of second volatile memory modules belonging to the different ranks;
  a first data line, coupled to the first volatile memory modules without crossing any one of the first volatile memory modules and configured to access at least one of the first volatile memory modules through a first continuous bit group;
  a second data line, coupled to the second volatile memory modules without crossing any one of the second volatile memory modules and configured to access at least one of the second volatile memory modules through a second continuous bit group;
  a first clock enable signal line, coupled to the first volatile memory modules and configured to control the first volatile memory modules to enter a self-refresh mode in parallel; and
  a second clock enable signal line, coupled to the second volatile memory modules and configured to control the second volatile memory modules to enter the self-refresh mode in parallel.

2. The circuit layout structure according to claim 1, wherein the first volatile memory modules are not controlled by the second clock enable signal line, and the second volatile memory modules are not controlled by the first clock enable signal line.

3. The circuit layout structure according to claim 1, wherein the first continuous bit group includes a plurality of continuous first data bits transmitted through the first data line, and the second continuous bit group includes a plurality of continuous second data bits transmitted through the second data line.

4. The circuit layout structure according to claim 1, wherein when the first volatile memory modules enter the self-refresh mode, the first clock enable signal line is at a low voltage level, and
  when the second volatile memory modules enter the self-refresh mode, the second clock enable signal line is at the low voltage level.

5. The circuit layout structure according to claim 1, further comprising:
  at least one clock signal line, coupled to the first volatile memory modules and the second volatile memory modules; and
  a command address signal line, coupled to the first volatile memory modules and the second volatile memory modules.

6. The circuit layout structure according to claim 5, wherein the at least one clock signal line and the command address signal line are coupled to a termination impedance circuit.

7. The circuit layout structure according to claim 6, wherein the first clock enable signal line and the second clock enable signal line are not coupled to the termination impedance circuit.

8. A memory storage device, comprising:
  a rewritable non-volatile memory module;
  a plurality of first volatile memory modules belonging to different ranks;
  a plurality of second volatile memory modules belonging to the different ranks;
  a first data line, coupled to the first volatile memory modules without crossing any one of the first volatile memory modules and configured to access at least one of the first volatile memory modules through a first continuous bit group;
  a second data line, coupled to the second volatile memory modules without crossing any one of the second volatile memory modules and configured to access at least one of the second volatile memory modules through a second continuous bit group;
  a first clock enable signal line, coupled to the first volatile memory modules and configured to control the first volatile memory modules to enter a self-refresh mode in parallel;
  a second clock enable signal line, coupled to the second volatile memory modules and configured to control the second volatile memory modules to enter the self-refresh mode in parallel; and
  a memory control circuit unit, coupled to the rewritable non-volatile memory module, the first data line, the second data line, the first clock enable signal line and the second clock enable signal line.

9. The memory storage device according to claim 8, wherein the first volatile memory modules are not controlled by the second clock enable signal line, and the second volatile memory modules are not controlled by the first clock enable signal line.

10. The memory storage device according to claim 8, wherein the first continuous bit group includes a plurality of continuous first data bits transmitted through the first data line, and the second continuous bit group includes a plurality of continuous second data bits transmitted through the second data line.

11. The memory storage device according to claim 8, wherein when the first volatile memory modules enter the self-refresh mode, the first clock enable signal line is at a low voltage level, and
when the second volatile memory modules enter the self-refresh mode, the second clock enable signal line is at the low voltage level.

12. The memory storage device according to claim 8, further comprising:
at least one clock signal line, coupled to the first volatile memory modules and the second volatile memory modules; and
a command address signal line, coupled to the first volatile memory modules and the second volatile memory modules.

13. The memory storage device according to claim 12, wherein the at least one clock signal line and the command address signal line are coupled to a termination impedance circuit.

14. The memory storage device according to claim 13, wherein the first clock enable signal line and the second clock enable signal line are not coupled to the termination impedance circuit.

15. A circuit layout structure, comprising:
a plurality of volatile memory modules, wherein the volatile memory modules include a plurality of volatile memory modules belonging to a first rank and a plurality of volatile memory modules belonging to a second rank, and only the volatile memory modules belonging to one of the first rank and the second rank are operated at a point in time;
a clock enable signal line, coupled to one of the volatile memory modules belonging to the first rank and one of the volatile memory modules belonging to the second rank; and
a data line, coupled to the one of the volatile memory modules belonging to the first rank and the one of the volatile memory modules belonging to the second rank without crossing any one of the one of the volatile memory modules belonging to the first rank and the one of the volatile memory modules belonging to the second rank.

16. The circuit layout structure according to claim 15, wherein the clock enable signal line is not coupled to a termination impedance circuit.

17. A memory storage device, comprising:
a rewritable non-volatile memory module;
a plurality of volatile memory modules, wherein the volatile memory modules include a plurality of volatile memory modules belonging to a first rank and a plurality of volatile memory modules belonging to a second rank, and only the volatile memory modules belonging to one of the first rank and the second rank are operated at a point in time;
a clock enable signal line, coupled to one of the volatile memory modules belonging to the first rank and one of the volatile memory modules belonging to the second rank;
a data line, coupled to the one of the volatile memory modules belonging to the first rank and the one of the volatile memory modules belonging to the second rank without crossing any one of the one of the volatile memory modules belonging to the first rank and the one of the volatile memory modules belonging to the second rank; and
a memory control circuit unit, coupled to the rewritable non-volatile memory module, the volatile memory modules, the clock enable signal line and the data line.

18. The memory storage device according to claim 17, wherein the clock enable signal line is not coupled to a termination impedance circuit.

* * * * *